United States Patent [19]

Mularie

[11] 4,430,184

[45] Feb. 7, 1984

[54] EVAPORATION ARC STABILIZATION

[75] Inventor: William M. Mularie, Stillwater, Minn.

[73] Assignee: Vac-Tec Systems, Inc., Boulder, Colo.

[21] Appl. No.: 492,831

[22] Filed: May 9, 1983

[51] Int. Cl.³ .................................... C23C 15/00
[52] U.S. Cl. ............................ 204/192 R; 204/164; 204/298; 118/50.1; 118/723; 427/37; 427/47
[58] Field of Search ............... 204/164, 192 R, 298; 118/50.1, 723; 427/37, 47; 219/76.16, 121 PL, 121 PV; 313/160, 161; 315/338, 344

[56] References Cited

U.S. PATENT DOCUMENTS

| | | | |
|---|---|---|---|
| 3,181,968 | 5/1965 | Mandorf, Jr. | 427/47 |
| 3,625,848 | 12/1971 | Snaper | 204/192 R |
| 3,793,179 | 2/1974 | Sabley et al. | 204/298 |
| 3,836,451 | 9/1974 | Snaper | 204/298 |
| 4,197,175 | 4/1980 | Moll et al. | 204/298 |

FOREIGN PATENT DOCUMENTS 1113579  5/1968  United Kingdom ................ 204/298

Primary Examiner—R. L. Andrews
Assistant Examiner—Terryence Chapman
Attorney, Agent, or Firm—Gerald J. Ferguson, Jr.; Joseph J. Baker

[57] ABSTRACT

Apparatus and method for evaporation arc stabilization including a target having a surface of material to be evaporated; circuitry for establishing an arc on the target surface for evaporating the target material, the arc being characterized by the presence of charged particles and a cathode spot which randomly migrates over the target surface; and a confinement ring contacting and surrounding the target surface, the ring being composed of a material such as boron nitride having (a) a secondary emission ratio less than one at the mean energies of the charged particles of the arc and (b) a surface energy less than that of the evaporated target material to thereby confine the cathode spot to the target surface. Further, the secondary emission ratio of the confinement ring is preferably less than that of the target.

30 Claims, 4 Drawing Figures

EVAPORATION ARC STABILIZATION

BACKGROUND OF THE INVENTION

This invention relates to arc stabilization processes and devices which may be employed, for example, in arc coating systems. Such coating systems are disclosed in U.S. Pat. Nos. 3,625,848 and 3,836,451 to Alvin A. Snaper and U.S. Pat. Nos. 3,783,231 and 3,793,179 to L. Sablev, et al. These systems are characterized by high deposition rates and other advantageous features. However, these advantages can be somewhat offset due to instability of the arc. That is, the arc involves currents of about 60 amperes, or more, concentrated into a cathode spot so small that current densities are $10^3$ to $10^6$ amperes per square inch. The voltages are 15 to 45 volts. Thus, power densities at the tiny cathode spot are in the order of megawatts/inch$^2$. Accordingly, local violence is an understatement. The target surface under the cathode spot flash evaporates from the intense heat. It is this evaporated target material which deposits as the coating on a substrate. The cathode spot migrates about the target surface in a random, jerky motion with reported velocities of many meters per second. Because of this random movement, damage to the device and contamination of the coating can occur if the spot moves off the target surface.

Different solutions to the arc instability problem have been proposed. Thus, in Sablev, et al., U.S. Pat. No. 3,793,179, a shield is placed close to the edge of the target. In particular, it is placed at a distance from the target which represents less than a mean free path of the gas present. In an arc discharge, gas and plasma are generated at the cathode spot with sufficient violence that local mean-free-paths may occasionally be reduced to a few thousandths of an inch. When such a blast of local high pressure is blown under the shield, which is spaced at several millimeters (~80 thousandths of an inch), there is finite possibility the arc can migrate under the shield. When this happens, there will be arc damage to the cathode, contamination of the evaporant, or the arc will extinguish.

Sablev, et al. U.S. Pat. No. 3,783,231 apparently addresses the foregoing problem by providing a feedback mechanism of some complexity that emphasizes the frustrations caused by the problem. The feedback involves the utilization of a magnetic field to retain the cathode spot on the target surface. U.S. Pat. No. 2,972,695 to H. Wroe also suggests the utilization of a magnetic field for cathode spot retention.

It is an object of the present invention to provide, in an arc coating device, stabilization of the arc in such a manner as to avoid the inadequacies and complexities of the prior art approaches.

Generally, this is effected by surrounding a predetermined area of the evaporation surface of the target with a confinement ring which contacts the target and directs the arc back to the evaporation surface whenever it wanders onto the confinement ring surface even if the ring is coated with conductive material evaporated from the target. As will be described in further detail hereinafter, materials from which the confinement ring may be fabricated are such that the ring is characterized by (a) a low absolute value of secondary electron emission ratio where preferably the ratio of the target is greater than that of the ring and (b) a low surface energy of the confinement ring relative to that of the evaporant.

Although the theory of operation is not completely understood, it is thought the above characteristics function in the following manner to effect the advantageous results of the present invention. Due to the confinement ring's low secondary electron emission ratio, the arc will return to the target whenever the arc wanders onto the ring surface. During the coating process, some of the target material evaporant may deposit on the ring. This could provide a bridge for the arc over the ring in spite of its low secondary emission ratio. However, due to the low surface energy relative to that of the evaporant, there is no wetting of the ring by the evaporant. Thus, the deposit is instantaneously evaporated by the arc so that the arc again contacts the confinement ring surface whereby it is returned to the target.

One material which possesses the above characteristics is boron nitride (BN). This material has been used as a wiper and insulator in high current switches. It has also been used as a nozzle on arc spray devices. In such devices, the refusal of BN to permit arcing against its surface is involved. However, in neither case is the BN heavily coated by target material in its operation as discussed above. Instances where BN has been employed for other purposes are disclosed in U.S. Pat. Nos. 3,202,862; 3,555,238; and 3,945,240.

In summary, a primary purpose of this invention is to provide an improved apparatus and method of arc stabilization which provides long term stability in a straightforward manner and which may be used in such applications as arc coating.

Other objects and advantages of this invention will be apparent from a reading of the following specification and claims taken with the drawing.

DETAILED DESCRIPTION OF PREFERRED EMBODIMENTS

Figures 1A, 1B:
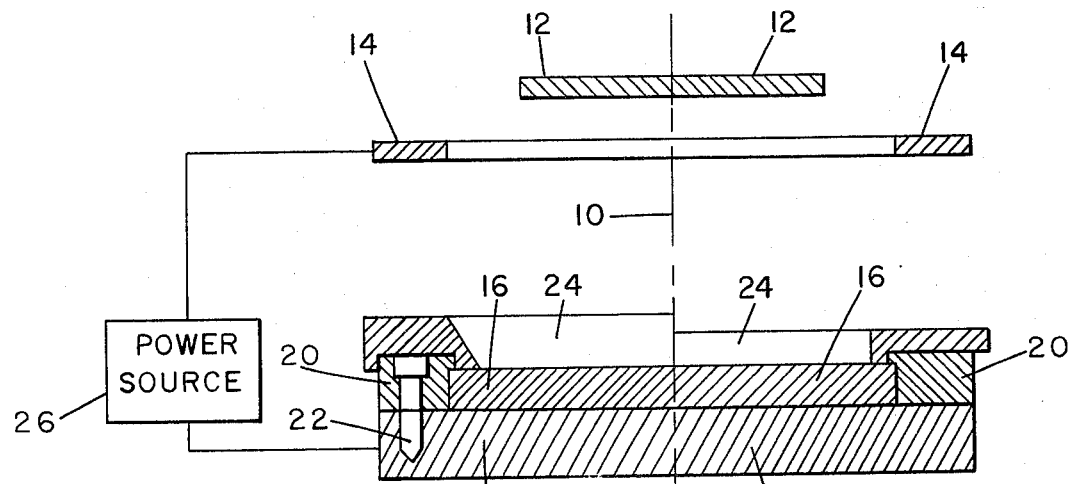
FIGS. 1A and 1B are diagrammatic illustrations of first and second embodiments where confinement rings in accordance with the invention are respectively employed with clamped targets.

Reference should be made to the drawing where like reference numerals refer to like parts. Further, each of the figures of the drawing illustrate one-half of a figure of revolution where the axis of symmetry of each figure is indicated at 10. Thus, with respect to FIGS. 1A and 1B, the left half of a complete embodiment is shown in FIG. 1A while the right half of a complete embodiment is shown in FIG. 1B.

In FIG. 1A, an arc coating system for a substrate 12 comprises an anode 14 where, if desired, the anode and substrate may be the same member, a target 16 of conductive or insulative material, a cathode 18 where, if desired, the target and cathode may be the same member, a clamp ring 20, a bolt 22, a confinement ring 24, and a power source 26, which is DC if the target is conductive and RF if it is insulative. In accordance with the invention, the confinement ring is composed of boron nitride or a similar material as discussed in more detail hereinafter.

In operation, source 26 is energized across the anode and cathode to strike an arc between the anode and target in a well known manner. Arc initiating means (not shown) may be employed to initiate the arc. Target material is then flash evaporated from the cathode spot formed at the root of the arc on the target surface and deposited on the substrate as a coating. Confinement ring 24 contacts target 16 and surrounds an exposed area constituting an evaporation surface of the target to thereby confine the cathode spot to the evaporation surface in such a manner that continuous, stable operation is effected for the entire lifetime of the target even though the ring may be overlayed with evaporated target material many mils thick.

Briefly, the confinement ring is made of a material such that the ring is characterized by (a) a low absolute value of secondary emission ratio where preferably the ratio of the target is greater than that of the ring and (b) a low surface energy of the ring relative to that of the evaporant.

The secondary emission ratio $\delta$ is defined as the number of secondary electrons produced by a primary electron, or other charged particle, incident upon a target. Thus, $$\delta = \frac{\text{number of electrons emitted by material}}{\text{per primary charged particle}}$$

The number of electrons emitted by the target is dependent not only on the particular target material but also on the energy of the primary charged particle. In accordance with one aspect of the present invention, the secondary emission ratio of the confinement ring, $\delta$ (confinement ring), should be less than one at the mean energies of the charged primary particles typically found in arc coating processes such as disclosed in the aforementioned Snaper and Sablev patents where these mean particle energies are about 20–100 eV. Moreover, the secondary emission ratio of the target, $\delta$ (target) is preferably greater than $\delta$ (confinement ring).

One class of materials which, generally speaking, has a $\delta < 1$ is the nitrides and boron nitride, in particular. The nitrides differ with respect to the oxide ceramics in that the oxides enhance secondary electron emission while the nitrides decrease it relative to the metals where the electron emission ratios for the different metals are approximately equal. This is consistent with the $\delta$ for alumina (Al$_2$O$_3$), which is about 15–20. This apparently accounts for the unstable arcing observed against alumina shields.

Boron nitride has been observed to be effective with metal targets. It also can be used with insulative targets, many of which have a high secondary electron emission ratio due to a substantial oxide content. Titanium nitride, even though quite conductive electrically, also restricts arc paths.

Another significant difference between the oxide ceramics and boron nitride and similar materials is that metallic coatings do not wet the latter materials. Hence, it appears evaporation of a conductive coating at the edge of a BN confinement ring readily occurs when an arc moves against it. The arc instantly evaporates the loose flap of coating for the coating is not thermally supported by bonding to the BN. This exposes a freshly cleaned insulating surface for at least a small distance at the edge of the confinement ring, making motion of the arc in a different direction away from the ring a most probable alternative. Further, once the poorly bonded coating at the edge of the ring is evaporated away, there will be very poor electrical contact between the conductive coating remaining on the ring and the target. This further reduces the chance of the arc proceeding onto the coating since 60 or more amperes requires rather a significant connection. Low current resistance measurements often show no electrical contact between target and coatings on the ring.

In general, a further aspect of the invention for effecting arc confinement is the low surface energy ($\gamma$) of the confinement ring relative to that of the evaporant—that is, $\gamma$(ring)<$\gamma$(evaporant). In this regard, BN (surface energy of 600–700 ergs/cm.$^2$) is not wet by most metals at the temperatures encountered in the arc coating processes described in the aforementioned Snaper and Sablev patents. Only the oxides of lead, bismuth, copper and antimony will wet and attack BN, the surface energies of these oxides ranging from 100–300 ergs/cm.$^2$. However, BN and materials similar thereto are suitable for the practical applications encountered in arc coating processes.

In summary, confinement ring 24 should be formed from or coated with materials having the foregoing characteristics. The nitride compounds are particularly suitable and, in particular, the nitrides of boron and titanium. In this regard, it should be noted if the nitride compound constitutes less than 100% of the confinement ring composition, the ring will nevertheless function in the desired manner as along as entire composition has the above-discussed characteristics.

Figures 1C, 1D:
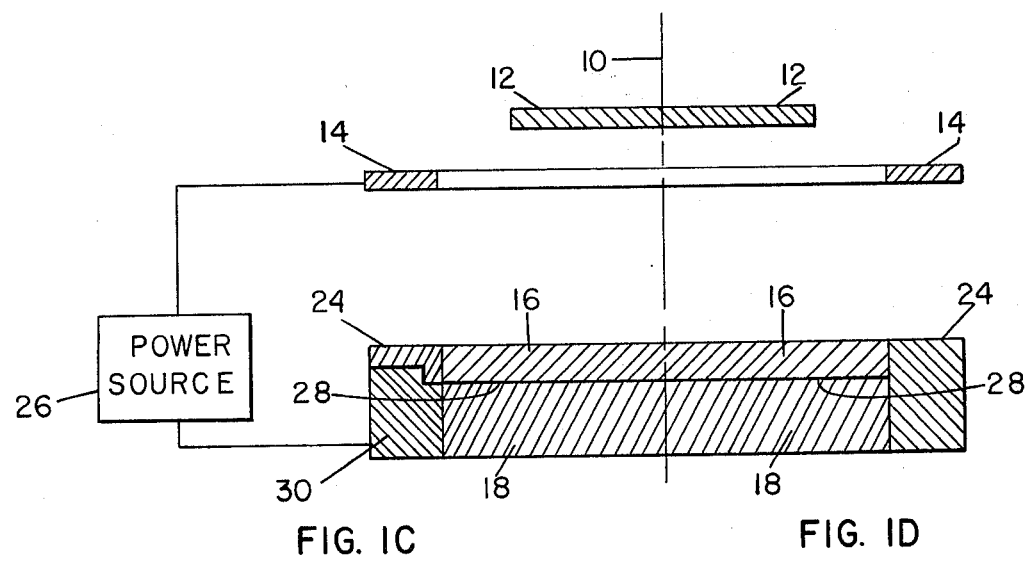
FIGS. 1C and 1D are diagrammatic illustrations of further embodiments where the target is bonded to the cathode.

Other configurations of confinement ring 24 are illustrated in FIGS. 1B, 1C and 1D where FIG. 1B illustrates another embodiment where the target is clamped to the cathode by ring 20 and bolts 22 (not shown in FIG. 1B) while the embodiments of FIGS. 1C and 1D illustrate bonding of the target 16 to the cathode 18 by appropriate means at the interface surface 28.

There is relatively little dependance on the confinement ring configuration and those of FIGS. 1A, 1B, 1C, and 1D are equally suitable with respect to the arc (cathode spot) containment function. Further, as illustrated in FIG. 1C the ring 24 may comprise a coating on a support member 30 where the coating is intentionally enlarged in thickness for purposes of illustration. If the ring is not formed by coating, it may be attached by bolts or other known expedients. If bolted, the heads of the bolts may be covered with the ring material.

Furthermore, the arc stabilization of the present invention permits non-cylindrical symmetry, for example, linear, rectangular cathodes and cylindrical arc sources, where magnetic confinement techniques such as those disclosed in the above-mentioned U.S. Pat. Nos. 3,783,231 and 2,972,695 cannot produce the necessary uniform fields for confinement. Moreover, the present invention operates over all pressure ranges (particularly high pressures) where the technique disclosed in the above-mentioned U.S. Pat. No. 3,793,179 is limited in this respect.

Although the preferred embodiments of the invention have been described in connection with an arc coating system, it is to be understood, it is also applicable to other systems where material is flash evaporated from a target by an arc which must be confined to a predetermined area of the target surface.

It is to be understood that the above detailed description of the various embodiments of the invention is provided by way of example only. Various details of design and construction may be modified without departing from the true spirit and scope of the invention as set forth in the appended claims.

I claim:

1. Apparatus for evaporation arc stabilization comprising
   a target having a surface of material to be evaporated;
   means for establishing an arc on the target surface for evaporating the target material, the arc being characterized by the presence of charged particles and a cathode spot which randomly migrates over said target surface; and
   a confinement ring contacting the target and surrounding the target surface, the ring being composed of a material having (a) a secondary emission ratio less than one at the mean energies of the charged particles of the arc and (b) a surface energy less than that of the evaporated target material to thereby confine the cathode spot to the target surface.

2. Apparatus as in claim 1 where the secondary emission ratio of the confinement ring is less than that of the target.

3. Apparatus as in claim 1 where the mean charged particle energies of said arc are 20–100 eV.

4. Apparatus as in claims 1 or 2 where the confinement ring comprises a nitride compound.

5. Apparatus as in claim 4 where the nitride compound is selected from the group consisting of boron nitride and titanium nitride.

6. Apparatus as in claim 1 including a substrate upon which the evaporated target material is deposited as a coating.

7. Apparatus as in claim 6 where the anode and substrate are the same member.

8. Apparatus as in claim 1 where said target is composed of an electrically conductive material.

9. Apparatus as in claim 8 where said electrically conductive material is metallic.

10. Apparatus as in claim 1 where said target is composed of an electrically insulative material.

11. Apparatus as in claim 1 where the means for establishing the arc on the target surface includes a cathode and an anode.

12. Apparatus as in claim 11 where said target is mounted on said cathode.

13. Apparatus as in claim 11 where said target and cathode are the same member.

14. Apparatus for evaporation arc stabilization comprising
   a target having a surface of material to be evaporated;
   means for establishing an arc on the target surface for evaporating the target material, the arc being characterized by a cathode spot which is randomly displaced over the target surface; and
   a confinement ring contacting the target and surrounding the target surface, the ring being composed of boron nitride to thereby confine the cathode spot to the target surface.

15. Apparatus as in claim 14 where the mean charged particle energies of said arc are 40–60 eV.

16. Apparatus as in claim 14 including a substrate upon which the evaporated target material is deposited as a coating.

17. Apparatus as in claim 16 where the anode and substrate are the same member.

18. Apparatus as in claim 14 where said target is composed of an electrically conductive material.

19. Apparatus as in claim 17 where said electrically conductive material is metallic.

20. Apparatus as in claim 14 where said target is composed of an electrically insulative material.

21. A method of evaporation arc stabilization comprising the steps of
   establishing an arc on a surface of a target to evaporate the target, the arc being characterized by the presence of charged particles and a cathode spot which randomly migrates over said target surface; and
   confining the arc to the target surface with a confinement ring which contacts and surrounds the target surface, the ring being composed of a material having (a) a secondary emission ratio less than one at the mean energies of the charged particles of the arc and (b) a surface energy less than that of the evaporated target material.

22. A method as in claim 21 where the secondary emission ratio of the confinement ring is less than that of the target.

23. A method as in claim 21 where the mean charged particle energies of said arc are 40–60 eV.

24. A method as in claim 21 where the confinement ring comprises a nitride compound.

25. A method as in claim 24 where the nitride compound is selected from the group consisting of boron nitride and titanium nitride.

26. A method as in claim 25 where the nitride compound is boron nitride.

27. A method as in claim 21 where said target is composed of an electrically conductive material.

28. A method as in claim 27 where said electrically conductive material is metallic.

29. A method as in claim 21 where said target is composed of an electrically insulative material.

30. A method as in claim 21 including depositing the evaporated target material on a substrate as a coating.

* * * * *